(12) United States Patent
Bird

(10) Patent No.: US 6,759,889 B2
(45) Date of Patent: Jul. 6, 2004

(54) DIODE MULTIPLEXER CIRCUIT AND ELECTRONIC DEVICE INCORPORATING THE SAME

(75) Inventor: Neil C. Bird, Horley (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 112 days.

(21) Appl. No.: 09/741,673

(22) Filed: Dec. 19, 2000

(65) Prior Publication Data

US 2001/0030569 A1 Oct. 18, 2001

(30) Foreign Application Priority Data

Dec. 21, 1999 (GB) .............................................. 9930155
May 17, 2000 (GB) .............................................. 0011767

(51) Int. Cl.[7] .............................................. H03K 17/62
(52) U.S. Cl. .................................... 327/407; 250/208.1
(58) Field of Search ................................ 327/407, 408, 327/493, 504, 583, 584, 585, 309, 314, 325; 250/208.1, 208.2, 214.1, 214 LS; 348/307, 308; 365/189.02

(56) References Cited

U.S. PATENT DOCUMENTS

| | | | |
|---|---|---|---|
| 4,728,802 A | * | 3/1988 | Baron ......................... 348/304 |
| 5,721,422 A | * | 2/1998 | Bird ......................... 250/208.1 |
| 6,075,247 A | * | 6/2000 | Wieczorek et al. .... 250/370.09 |

FOREIGN PATENT DOCUMENTS

| | | |
|---|---|---|
| WO | 97/25779 | 7/1997 |
| WO | 98/49691 | 11/1998 |

OTHER PUBLICATIONS

"A High Speed Analog To Digital Converter" by Carl David Todd in Semiconductor Products, Mar. 1961, pp. 29–37, Cowan Publ. Corp. Washington.

* cited by examiner

Primary Examiner—Linh M. Nguyen
(74) Attorney, Agent, or Firm—Aaron Waxler

(57) ABSTRACT

A multiplexer circuit is disclosed for switching a selected one of a plurality of current inputs carried by respective input lines (2;101) to a common output. The circuit comprises, for each input line, a diode clamp (5;104) and isolation means (10;109) provided between each input line and the common terminal The diode clamp (5;104) is operable in a first mode in which voltages are applied to the clamp terminals such that the diodes (8,9;107,108) of the diode clamp are forward biased and hold the input line (2;101) at a first voltage which prevents the passage of current from the input line to the common output, and a second mode in which the voltages are applied to the clamp terminals such that the diodes of the diode clamp are reverse biased and the passage of the current from the input line to the common output is allowed. Only two connections, for the diode clamp, are needed to control the switching of the current input, and the switch introduces no current offset to the output.

8 Claims, 6 Drawing Sheets

DIODE MULTIPLEXER CIRCUIT AND ELECTRONIC DEVICE INCORPORATING THE SAME

BACKGROUND OF THE INVENTION

This invention relates to multiplexer circuits for switching signals and to electronic devices including such. More particularly, the invention is concerned with multiplexer circuits for switching signals from arrays of electrical elements or to arrays of electrical elements arranged in rows and columns and to column multiplexer circuits for use therewith. Particularly, but not exclusively, the electrical elements form the pixels of an image or fingerprint sensor array, and these pixels may include diodes.

Optical sensor arrays having pixels which include photodiodes are known, for example as described in WO97/25779. Fingerprint sensor arrays are also known which have pixels using diodes as switching elements, and having a capacitive element which stores a variable charge according to the profile of a fingerprint in contact with the array. In each case, enhanced spatial resolution is achieved by reducing the size of the pixels. However, external connection to the array becomes difficult as the pixel spacing is reduced.

It is known to use multiplexer circuits for external connection to rows or columns of pixels in high resolution arrays. Each multiplexer circuit links a number of inputs to a single output, which may then provide the external connections. External connections are not then required for each row or column, but may be provided only for the output of each multiplexer circuit. External conductors required for the control of the multiplexer circuits can be shared between all of the multiplexer circuits associated with the array, so that only a limited number of additional external connections are needed for control purposes. Thus, the total number of external connections needed for the array is greatly reduced by the use of multiplexer circuits.

Multiplexer circuits formed only from diodes are also known and referred to herein as diode multiplexer circuits. The use of diodes as the switching devices within the multiplexer circuits facilitates the integrated manufacture of a device which combines, on the same substrate, a diode-based pixel array and multiplexer circuits, both being fabricated by common processes.

An example of a diode multiplexer circuit used in conjunction with a device having an array of pixels is disclosed in WO 97/25779. This circuit has multiplexer switches connected to each column of the array. Each switch incorporates a diode bridge. The four connection points around the bridge define an input, output and two control terminals. The control terminals enable the four diodes to be switched between forward bias, when the input is linked to the output, and reverse bias, when the output is isolated from the input. Non-uniformity of the output characteristics of the diodes of the bridge gives rise to a DC offset current introduced between the voltage appearing on the output and a fixed voltage level. Some applications involve integrating a current signal at the column output, using a charge measurement circuit which operates at a fixed voltage. The DC offset must be integrated and subtracted out later in the signal handling chain, or be removed via an analogue offset removal circuit. The need to remove this offset current generally adds to the complexity of any system incorporating the multiplexer circuit.

Any reduction of the number of diodes needed for a multiplexer circuit will further facilitate the manufacture of these devices and may allow arrays incorporating them to achieve higher yields for a given array size.

SUMMARY OF THE INVENTION

According to the present invention, there is provided a multiplexer circuit for switching a selected one of a plurality of current inputs carried by respective input lines to a common output, the circuit comprising, for each input line:
  a diode clamp comprising first and second clamp terminals and first and second clamp diodes arranged in series with the same polarity between the clamp terminals; and,
  isolation means provided between each input line and the common terminal,
wherein the diode clamp is operable in two modes, a first mode in which voltages are applied to the clamp terminals such that the diodes of the diode clamp are forward biased and hold the input line at a first voltage which prevents the passage of current from the input line to the common output, and a second mode in which the voltages are applied to the clamp terminals such that the diodes of the diode clamp are reverse biased and the passage of the current from the input line to the common output is allowed.

Only two connections, for the diode clamp, are needed to control the switching of the current input. This is an improvement over the four connections needed for multiplexer circuits which incorporate a diode bridge in the switch.

The diode clamp used in the manner of the invention provides a simple diode-based circuit for controlling the passage of current from a number of inputs to a common output. In the second mode, the output current flows directly from the column, so no offset voltage is introduced by the clamp arrangement. Hence, the need to remove consequential offset currents added to the signal currents at a later stage is avoided.

The isolation means may comprise an isolation diode, and in this case the first voltage may be selected to reverse bias the isolation diode to prevent current flowing from the input line to the common output.

The isolation means may alternatively comprise an isolating capacitor, and in this case the first voltage may be selected depending on the source of the input current, such as to prevent current flowing from the source of the input current to the common output. The isolation capacitor does not itself prevent the passage of current, but it enables different input lines to be held at different voltages even though they are each coupled to a common output.

The present invention also provides an electronic device comprising an array of charge storage elements which are arranged in rows and columns and which are coupled to row and column conductors, the column conductors being arranged in at least one group, each group having a respective common output, a multiplexer circuit according to the present invention as set out above coupling the column conductors of the respective groups to the respective common output, and a charge measurement device which measures the flow of charge from the common output.

The charge storage elements may comprise photosensitive pixels including a photodiode and a switching diode. In this case, the first voltage may be selected to reverse bias the switching diode. Preferably, in this case, the isolation means comprises an isolation capacitor.

During the second mode, charge may be arranged to flow from each input to the respective isolation capacitor. The diode clamp may then be operable in a third mode in which voltages are applied to the clamp terminals such that the diodes in the diode clamp are forward biased and hold the input line at a second voltage which causes charge stored on the isolating capacitor to flow between the isolating capacitor and the charge measurement device.

This mode allows indirect reading of the signal charges from the charge storage elements by allowing charge to be transferred from the charge storage elements to the isolation capacitors when the diode clamp is in the second mode. This charge can subsequently be measured in the third mode by selectively draining the isolation capacitors through the respective diode clamps. This flow of charge can be measured by the charge measurement device.

The charge storage elements may comprise capacitive charge storage elements including two diodes and a variable capacitor, the current measurement being used to determine the capacitance. In this case, the isolation means may comprise an isolation diode.

As mentioned previously, the output signals of multiplexer circuits according to the present invention are free of the DC offset signal that is introduced by multiplexer circuits incorporating diode bridges in the switches. The present invention overcomes this problem by the current at the output being supplied directly by the current at the input rather than being supplied by an external source and only matched to the input current by a diode bridge.

The lack of DC offset eliminates the need for offset cancellation arrangements, such as subtracting out after integration by charge sensitive amplifiers or removal by an analogue offset removal circuit. Apart from simplifying the integrated circuit drivers, this allows for a faster read-out process since the need to allocate time slots for the operation of calibration loops or the like is removed. This speed may be traded off for a higher multiplexer ratio.

Multiplexer circuits according to the present invention require fewer diodes than multiplexer circuits employing diode bridges, allowing arrays including integrally formed multiplexers, fabricated together with the pixel array, to achieve better yields.

The elimination of the diode bridge reduces signal attenuation and means there is no direct feed of noise via the bridge to the amplifier. This reduces sensitivity to amplifier input offset voltages and improves the signal to noise ratio of the circuit.

BRIEF DESCRIPTION OF THE DRAWINGS

Embodiments of the present invention will now be described, by way of example, with reference to the accompanying drawings, in which.

DESCRIPTION OF THE PREFERRED EMBODIMENTS

Figure 1:
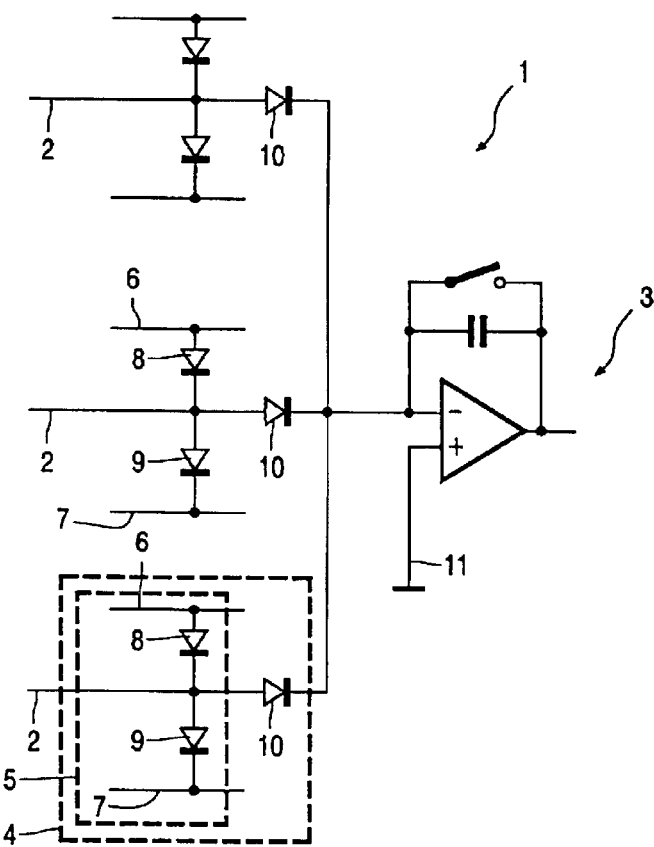
FIG. 1 shows a multiplexer circuit according to a first embodiment of the present invention.

FIG. 1 shows a first example of a multiplexer circuit 1 of the invention for switching a current flowing to a selected input to a common output. This example of multiplexer circuit may be used, for example, with capacitive sensing elements of a fingerprint sensing array. The multiplexer circuit 1 has as inputs a set of columns 2, there being three in this example, and has a multiplexer switch 4 for each column. Each multiplexer switch 4 includes an isolating diode 10 to allow the column 2 to be selectively isolated from a shared charge sensing amplifier 3 and from the other columns. This prevents the amplifier communicating with all of the columns 2 simultaneously. Isolation is achieved by reverse biasing the isolation diode 10.

Each switch 4 has a diode clamp 5 consisting of a positive supply terminal 6, a negative supply terminal 7, and two clamp diodes 8 and 9. The clamp diodes are connected in series with the same polarity (in a forward direction) between the terminals 6,7. The diode clamp 5 allows control of the voltage at the respective column 2. Each isolating diode 10 may be selectively reverse biased by appropriate voltages applied by the diode clamp.

To allow each switch 4 to be controlled individually, separate external connections are provided for each pair of positive and negative supply terminals 6 and 7. The diode clamps may be referred to as being "on" when the diodes of the clamp are forward biased and "off" when reverse biased, or at least not forward biased. When in the "on" state, the diodes of the clamp provide a voltage divider. In the embodiments described herein the two diodes are identical so the voltage to which the column is held is half way between the voltages applied to the clamp terminals.

A typical operation of the multiplexer circuit 1 is to allow the charge flowing from each column 2 to be integrated by the charge-sensitive amplifier 3 in sequence by maintaining a reverse bias on the isolating diodes corresponding to the out-of sequence, non-selected, columns.

Figure 2:
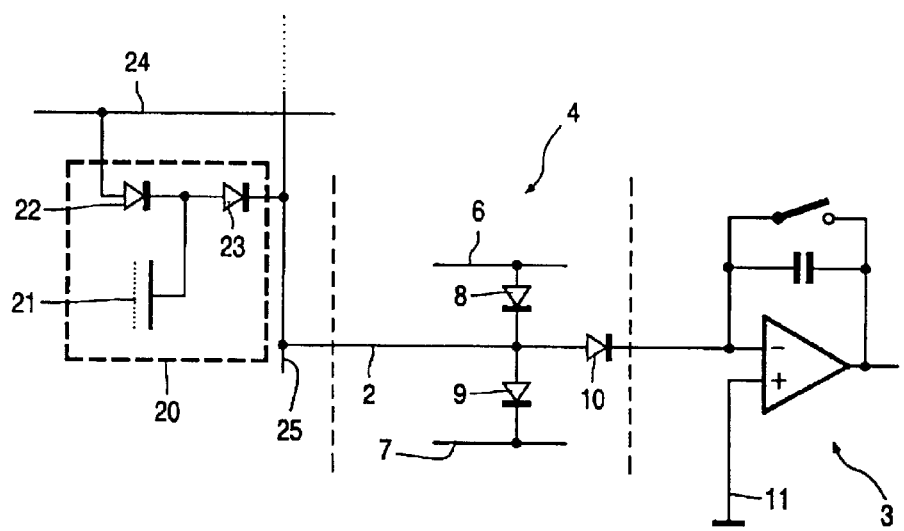
FIG. 2 shows a pixel of a fingerprint sensor connected to a single switch of the multiplexer circuit of FIG. 1.

FIG. 2 illustrates the relationship between a pixel 20 of a fingerprint sensor and a single multiplexer switch 4 connected to the amplifier 3.

The pixel 20 of the fingerprint sensor contains a capacitive sensing element 21 connected at the junction of a supply diode 22 and a switching diode 23. The sensing element 21 comprises a sensing electrode covered by a layer of dielectric material and the dielectric material of all the elements in the row and column array provide a sensing surface over which a person's finger is placed forming capacitors at each sensing element whose capacitance is determined by whether a fingerprint trough or ridge is present at that location. The anode of the supply diode 22 is connected to a row conductor 24. The switching diode 23 is connected at its cathode to a column conductor 25. The sensing element 21 can only discharge when the diode 23 is forward biased, and the switching diode 23 may be forward or reverse biased by means of voltages applied at the row conductor 24 and the column conductor 25.

An example of a diode-based capacitive fingerprint sensing array is described in WO98/49691 to which reference is invited for further details of the construction and general operation.

Reading a signal charge from a pixel 20 may be described as a 3 step process.

The first step, row addressing, pre-charges the sensing element. To do this, a positive voltage, of for example 4V, is supplied to the pixel by the row conductors 24. The switching diode 23 is reverse-biased, by ensuring that an appropriate voltage is on the column conductor 25, to prevent the supply diode 22 and switching diode 23 acting as a voltage divider, which would reduce the voltage at the sensing element 21. The isolating diode 10 is also reverse biased to isolate the column, which is at a raised voltage to reverse bias the switching diode 23, from the amplifier 3. This is achieved by raising the positive terminal 11 of the amplifier 3 to at least the same voltage as the column conductor 25. The voltage on the column conductor is dictated by the voltage clamp 5 to ensure the reverse bias of the switching diode 23.

The charge stored on the element 21 during this time is a function of the capacitance, which depends upon whether a ridge or a trough of the fingerprint being sensed is present.

The row address step terminates when the row conductor 24 is returned to 0V. At this point, the sensing element 21 is charged and the supply diode 22 is reverse biased.

In the next step, the voltage at the column conductor 25 is set back to 0V ready for the amplifier 3 to measure the charge stored on the sensing element 21. The clamp diodes 8 and 9 are again forward biased, but this time the bias voltages are chosen to clamp the column 2 to 0V. This might correspond to +2V and −2V being applied to the supply terminals.

During this step the switching diode 23 may become forward biased and a small amount of charge from the sensing element 21 may leak to the column and be lost through the diode clamp 5. To minimise this loss of charge, this step is kept as short as possible. A duration of 1–2 microseconds is suitable and may result in only 10–20% loss of charge from the sensing element 21.

In the final step of the reading process, the charge stored on the sensing element 21 is integrated by the amplifier 3. The diode clamp 5 is switched off, allowing the voltage at the column 2 to "float", and a feedback switch on the amplifier is opened. The diode clamp 5 therefore introduces no offset voltage and the charge measurement circuit 3 can produce a signal which does not require offset correction. For this measurement step, the voltage applied to the positive terminal 11 of the amplifier 3 is lowered to ensure that the isolating diode 10 is forward biased. Typically, −1V at the positive terminal 11 of the amplifier 3 takes account of the voltage drop across the isolating diode.

The operation of the multiplexer circuit 1 of FIG. 1 will now be described for use with a plurality of columns of pixels.

The charge flowing along each column 2 is read by the three step process described above in sequence. Throughout the process of reading from a single, selected column, isolation of the non-selected columns from the amplifier must be maintained. This is achieved by reverse biasing the isolating diodes 10, as described above. Switches with a reverse biased isolating diode 10 are referred to herein as "open".

During the row addressing step, all diode clamps 5 are switched "on" to reverse bias both the switching diode 23 and the isolating diode 10. The clamp diodes 8 and 9 are forward biased and the columns 2 are clamped to a voltage equal to or lower than the positive terminal 11 of the amplifier 3. Typically, the voltage at these columns 2 might be 3V. This voltage must also be high enough to ensure that the switching diodes 23 of the pixels are reverse biased, so that the sensing elements can be charged by the row conductor 24.

During the second step of the reading process for the selected column, the diode clamp 5 for the selected column is turned off, whereas the other diode clamps remain "on", maintaining the switches "open" for the non-selected columns.

During the third, integration step, the voltage at the positive terminal 11 of the amplifier 3 is reduced. To maintain the isolation of the other columns 2, the voltage at these columns 2 is reduced by means of their respective diode clamps 5. The typical voltage applied to the columns 2 by the diode clamps 5 is −1V.

To read out a complete set of pixels 20 connected to the multiplexer circuit 1, a row addressing step is required each time a column 2 is selected. This is because during the integration step for each selected column 2, the non-selected columns 2 are clamped to −1V to maintain the switches open. This causes the corresponding switching diodes 23 to be forward biased, allowing the sensor elements 21 to discharge, thereby requiring additional row addressing steps to recharge the respective sensor elements 21.

Each row of pixels in the array is read out in similar manner in sequence.

The multiplexer circuit described above requires only three diodes for each switch. Only a small area of the array substrate is required for the diodes, and an improved yield may be achieved.

Figure 3:
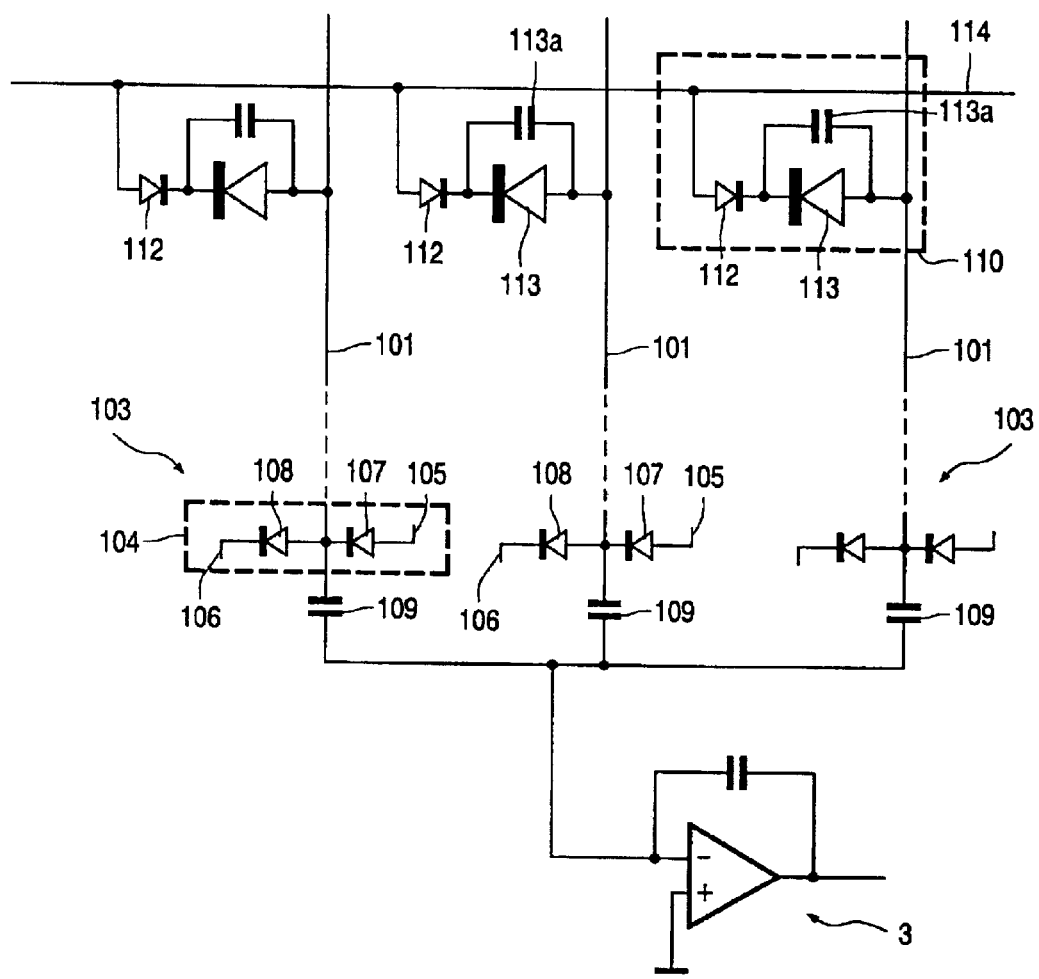
FIG. 3 shows a multiplexer circuit according to an alternative embodiment of the present invention.

FIG. 3 shows a second example of a multiplexer circuit of the invention, for use as a column multiplexer circuit 100 for an array of photosensitive pixels.

The multiplexer circuit 100 has three multiplexer switches each connected between a column 101 and a common charge-sensitive amplifier 3. Each switch 103 consists of a diode clamp 104 and an isolating capacitor 109. Each diode clamp 104 is formed from two clamp diodes 107 and 108 connected with the same polarity between positive and negative clamp supply terminals 105 and 106 respectively. The diode clamps 104 allow the voltage at each column 101 to be controlled individually, and the isolating capacitors 109 allow the voltage between each of the columns 101 and the common output to differ. The positive terminal of the charge sensitive amplifier 3 is earthed.

The diode clamp has the same function as for the previous embodiment.

The column multiplexer circuit 100 is shown connected to a single row of photosensitive pixels 110. Each pixel 110 contains a photodiode 113, having an associated photodiode capacitance 113$a$, and a switching diode 112. The capacitance 113$a$ may be the self-capacitance of the photodiode or it may be an additional component. The anode of the switching diode 112 is connected to a row conductor 114 and the cathode is connected to the cathode of the photodiode 113. The anode of the photodiode 113 is connected to the column 101.

Operation of the multiplexer circuit 100 is now described with reference to the overall process for acquiring an image from the sensor array. The image acquisition process broadly consists of three steps, and the final step may be carried out according to two different processes.

The first step of the image acquisition process ensures that all of the pixels have been reset to a known starting state, in terms of the charge stored on the capacitance 113$a$ associated with the photodiode 113. This is achieved by clamping the columns 101 to 0V, and simultaneously pulsing all of the row conductors 114 to a positive voltage, such as 4V. This may be referred to as the row selection voltage. This forward biases the switching diode 112 in series with the capacitor 113$a$, and causes the capacitor 113$a$ to charge to a fixed level.

The second step in the image acquisition process is exposure of the array to light. All rows 114 are grounded and the columns 101 are clamped to a positive voltage in preparation for the read-out of the image data. This voltage ensures that the switching diode 112 is reverse biased and that charge can not flow to earth through the diode clamp. During this period, the photodiode capacitance discharges as a function of the incident light.

In the final step, a signal charge is read out from the pixel 110. To do this, the row conductor 114 is pulsed to a positive, selection voltage, +4V for example, so that the switching diode 112 is forward biased and charge flowing through the capacitance 113a, as it is recharged to the fixed level, is detected at the charge sensitive amplifier 3. The overall flow of charge represents the amount by which the capacitor was discharged during the image acquisition, and is a function of the light intensity incident on the pixel during that time.

There are two alternative processes, for this final step, for reading the charge stored on the capacitance 113a. These are referred to below as the direct read process and indirect read process. In each case, the isolation capacitor functions to enable different voltages to be supported on the different columns, so that the columns may be controlled individually.

Figure 4:
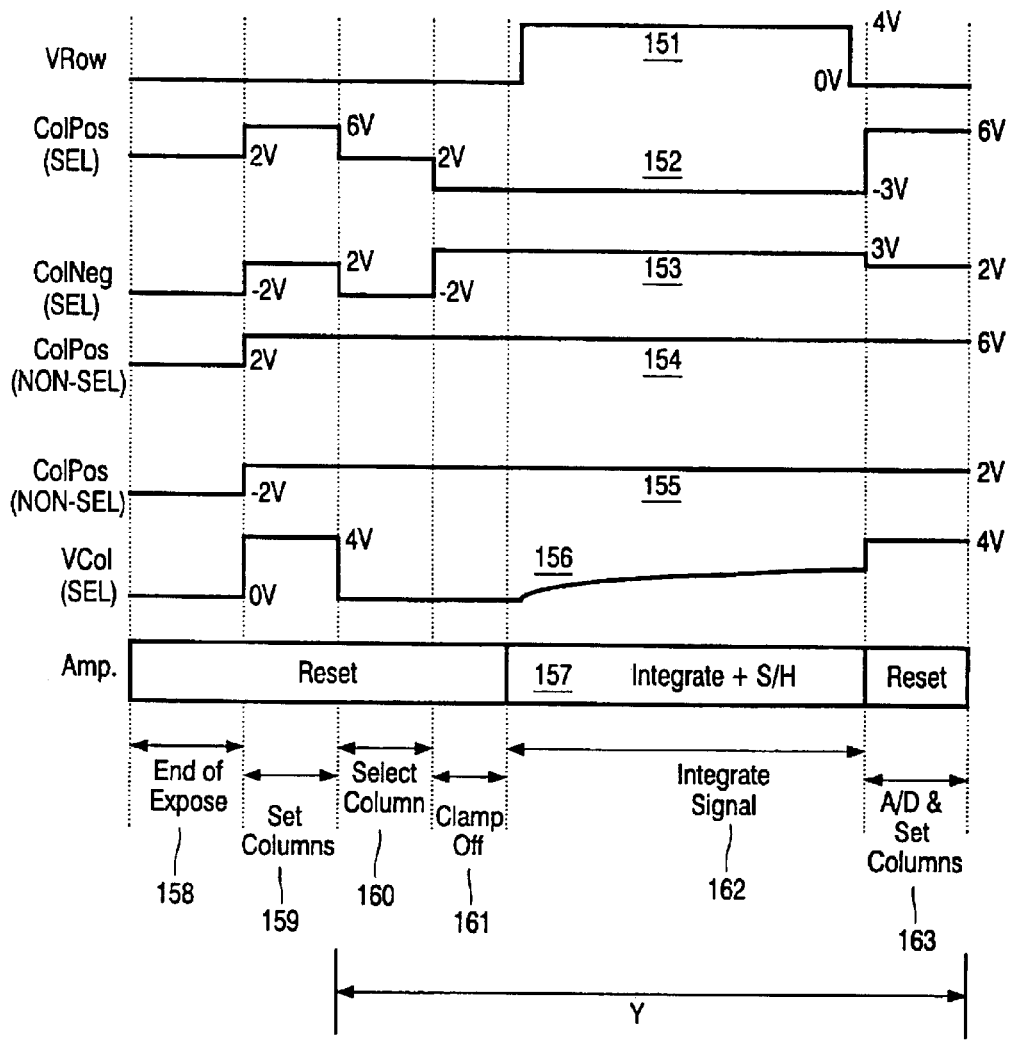
FIG. 4 is a state diagram depicting the operation of the multiplexer circuit of FIG. 3 in a direct-read process.

FIG. 4 is a timing diagram for the direct-read process of the read-out process and shows seven voltage profiles, 151 to 157. The first profile 151 depicts the voltage applied to a single row conductor 114. The next two profiles 152 and 153 depict the voltages applied to the positive supply terminal and negative supply terminal, 105, 106 respectively, of the diode clamp 104 associated with the column of the pixel to be read. The next two profiles 154 and 155 depict the voltages applied to the positive and negative supply terminals 105, 106 of diode clamps 104 associated with non selected columns. The next profile 156 depicts the voltage applied to the selected column 101 by the diode clamp 104, to which voltages 152 and 153 are applied. The bottom profile 157 depicts the states of the charge-sensitive amplifier 3.

FIG. 4 also shows six distinct states of the multiplexer circuit 100 required by the direct read process for reading signal charge from pixels 110. The first two of these states are common to all columns of a multiplexer circuit, and the last four are repeated for each individual column of the multiplexer circuit 100.

The first state 158, referred to as the end-of-exposure state, is the state of the column multiplexer 100 at the end of the light exposure period. The diode clamps are "on" and the columns are all held at 0V. To achieve this, voltages 152 and 153 are +2V and −2V respectively so the clamp diodes 107 and 108 are each forward biased by 2V.

During the next state 159 all the columns 101 are "set" by being driven to the voltage for reverse biasing the switching diodes, typically 4V. This ensures that, after the next step, non-selected columns 101 are isolated from the charge sensitive amplifier 3.

In the next state 160, the column 101, having the pixel 110 for which charge is to be read, is selected by driving to 0V. This is achieved by applying +2V and −2V to the positive and negative supply terminals of the diode clamp 104 to switch it on. The positive and negative supply terminal of the diode clamps 104 associated with non-selected columns 101 are driven to +6V and +2V so that these diode clamps are switched on and hold the respective columns 101 at +4V, maintaining reverse bias of the switching diodes 112.

The state 159 could be omitted from the selected column, thereby rendering the state 160 redundant.

In the next state 161 the diode clamp 104 corresponding to the selected column 101 is turned off, allowing the voltage of the column 101 to "float". This is achieved by voltages 152 and 153 being −3V and +3V respectively, which corresponds to the diodes 107 and 108 of the clamp 104 associated with the selected column 101 being reverse biased.

In the next state 162 the signal charge from the pixel connected to the selected column 101 is integrated. For this purpose, the row voltage is pulsed, for example to 4V. The action of the switches 103 for the non-selected columns 101 isolates the pixels connected to these columns 101 from the charge-sensitive amplifier 3, despite the increased row voltage. Thus, the column voltage must be sufficient still to apply a reverse bias to the switching diodes 112 for the non-selected columns. The signal received at the charge-sensitive amplifier 3 then represents the charge signal of the pixel 110 connected to the selected column 101.

For the pixel connected to the selected column, the positive voltage pulse applied to the row conductor 114 forward biases the switching diode 112. This allows charge to flow from the capacitance 113a associated with the photodiode 113 to the isolating capacitor 109 associated with the selected column 101 (and also to any parasitic capacitance of other pixels of the array that might be communicating with the column 101). The corresponding current flowing in the isolating capacitor 109 associated with the selected column 101 is detected at the charge-sensitive amplifier 3 which then generates an output voltage proportional to the amount of photo-charge that was generated by the photodiode during the preceding illumination period.

In the final state 163 the output voltage from the charge-sensitive amplifier 3 is passed to an analogue-to-digital converter. At the same time the column 101 which has just been read from is driven back to the off voltage, +4V.

The last 4 states 160–163, indicated Y in FIG. 4, are repeated for each column 101 (i.e. each column multiplexed channel) in sequence.

Figure 5:
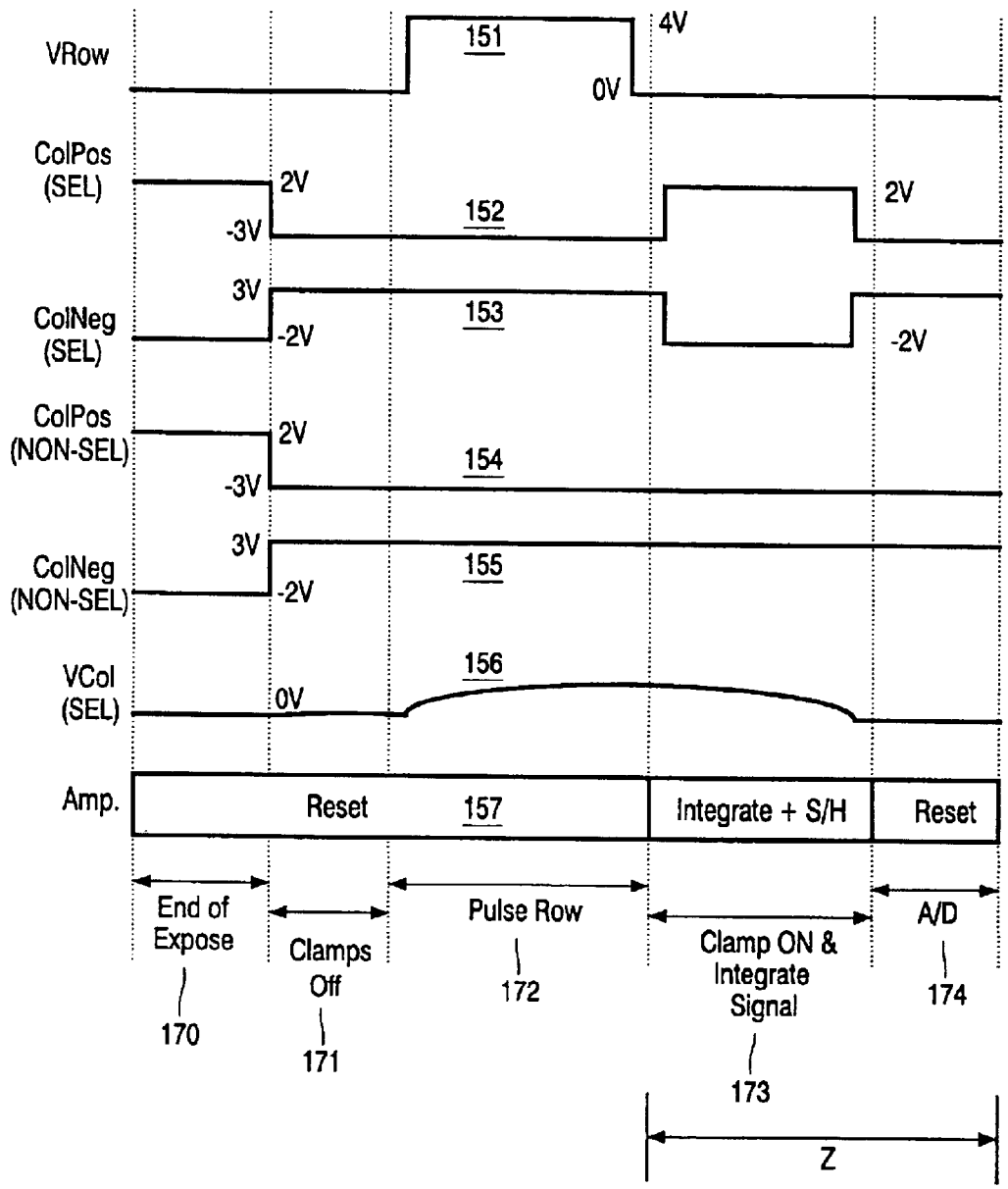
FIG. 5 is a state diagram depicting the operation of the multiplexer circuit of FIG. 3 in an indirect-read process.

FIG. 5 is a timing diagram for the indirect read process of the read-out of signal charge from the pixels connected to the multiplexer circuit 100. This timing scheme requires only one row pulse per row of pixels as opposed to one for each column as in the case of the direct-read scheme. This timing diagram has the same seven profiles as that of FIG. 4 but only has only five states. The first three of these states are common to all columns 101, and the final two states are repeated for each column 101 as it is selected.

The first state 170 is the state of the column multiplexer circuit 100 at the end of the light exposure period. The diode clamps 104 for all columns 101 are "on", clamping the columns 101 to 0V.

In the next state 171, the diode clamps are turned "off" ready for the row pulse. The common terminal is at 0V by virtue of the amplifier 3.

In the next state 172, the row pulse is applied to the row conductor 114. As all of the columns are at 0V as a result of state 170 the positive row pulse forward biases all of the switching diodes 112 in the pixels and current flows through the pixels and down the columns 101. These currents charge both the isolating capacitance 109 associated with each column 101 (and also a parasitic capacitance associated with other pixels that may be connected to the same column 101). A proportion of the signal charge stored on each capacitance 113a is copied to the isolating capacitor 109 of the respective column 101.

In the next state 173, the charges stored on each of the isolating capacitors 109 may be integrated one by one. First, the charge-sensitive amplifier 3 is put into an integration mode. Then the diode clamp 104 associated with the selected column 101 is pulsed on by means of voltages 152 and 153 being +2V and −2V respectively. This clamps the selected column 101 back to 0V and causes the charge stored on the associated isolating capacitor 109 to flow out through the diode clamp 104 in a reverse direction to the current supplied by the pixel 110. This movement of charge, which is representative of the charge stored in the pixel 110, is detected at the charge-sensitive amplifier 3 and integrated.

In the final state 174 the signal supplied by the charge-sensitive amplifier 3 is then passed through an analogue-to-digital converter before being stored.

The last two states 173 and 174, indicated at Z, are repeated for each column 101 in sequence.

Figure 6:
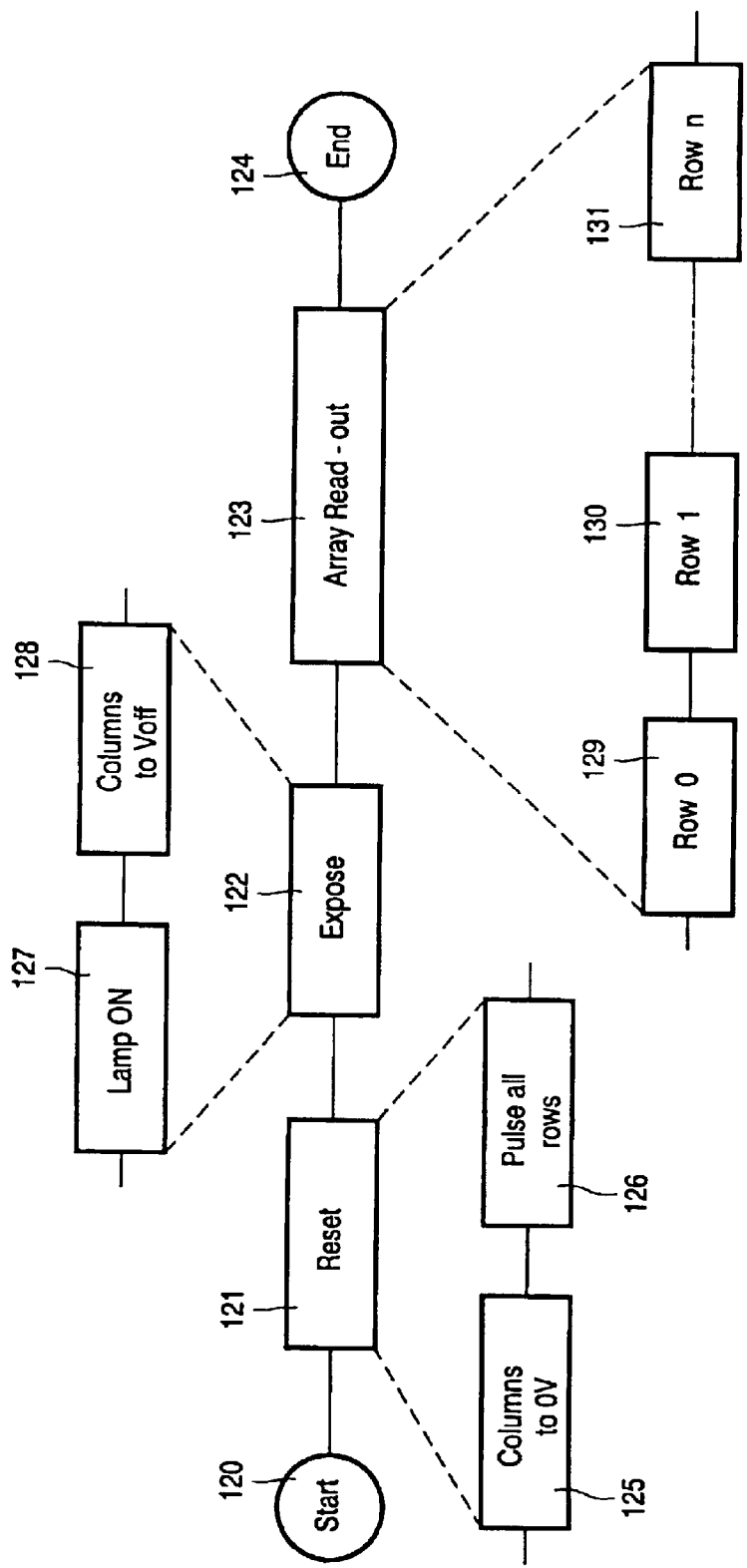
FIG. 6 depicts the process of acquiring an image using the multiplexer circuit of FIG. 3.
Figure 7:
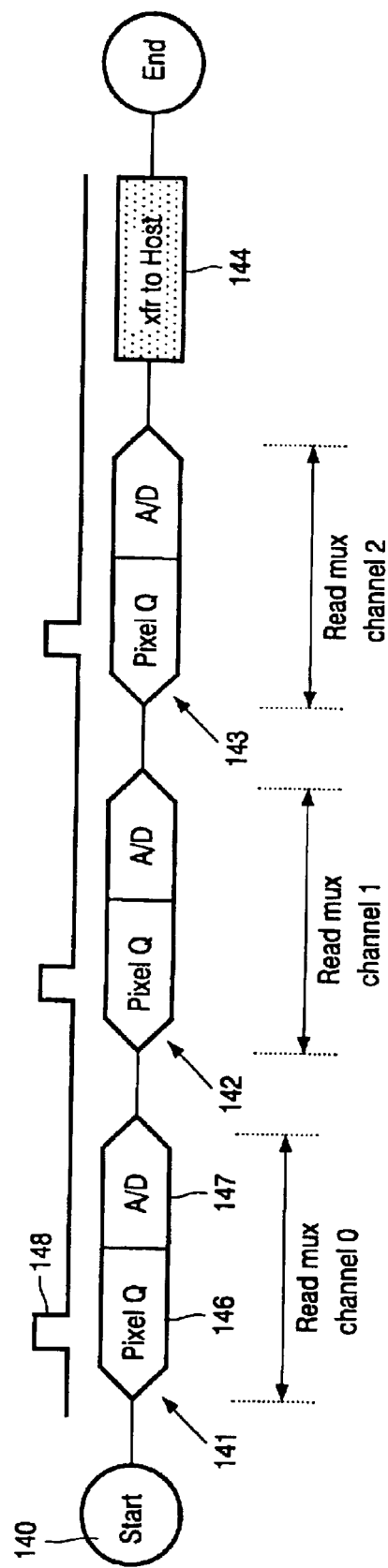
FIG. 7 depicts the read-out step of the process of FIG. 6 in which either of the processes depicted in FIGS. 4 or 5 may be applied.

FIGS. 6 and 7 depict an image acquisition process for an entire array consisting of multiple rows and columns. Although the multiplexer circuit described above has only 3 columns 101, this may be generalised to n columns.

FIG. 6 shows the progression from the start 120 to the reset step 121, the exposure step 122, the array-read-out step 123 and then the end of the process 124. The reset step involves setting the columns to 0V at step 125 and then pulsing the row conductor 114 to a positive voltage at step 126. The exposure step involves switching on a lamp to expose the pixels to light at step 127 and then clamping the columns to a voltage Voff to reverse bias the photodiodes.

Array-read-out step 123 involves reading out each row 129–131 from a set of n rows, depicted by boxes 129 to 131.

FIG. 7 depicts the process of reading the signal charge from the pixels in a single row. This diagram assumes that the reset operation has already taken place and the light source has been pulsed "on", as described above. The process of reading the entire row is built up by repeating the execution of the process as used to read signal charges from one of the end multiplexer channels. FIG. 7 shows a read out process for three multiplexer channels as boxes 141 to 143. A two-stage process 146 and 147 is executed for each channel. The first stage 146 is charge acquisition which occurs when the row is pulsed 148 and charge is transferred to the charge-sensitive amplifier 3 through the column multiplexer 100. Once this is complete an analogue-to-digital conversion of the signal from the amplifier 3 is performed.

The charge acquisition and analogue-to-digital conversion is executed n times in total, once for each multiplexer channel. At the end of these acquisitions, a line store contains a complete row of data from the array and this data is then transferred at step 144 to the host before the next row acquisition begins.

This embodiment provides multiplexer circuits for an optical sensing array which provides a signal free of the DC offset signal that is introduced by multiplexer circuits incorporating diode bridges in the switches.

From reading the present disclosure, other modifications will be apparent to a person skilled in the art. Such modifications may involve other features which are already known in the design and use of electrical or electronic circuits and component parts thereof and which may be used instead of or in addition to features already described herein.

What is claimed is:

1. A multiplexer circuit for switching a selected one of a plurality of current inputs carried by respective input lines to a common output, said circuit comprising, for each respective input line:
    a diode clamp including first and second clamp terminals and first and second clamp diodes arranged in series with the same polarity between said clamp terminals; and
    isolation means provided between each respective input line and said common output,
    wherein each input line is connected only to the isolation means and to a point between said first and second clamp diodes, and wherein said diode clamp is operable in two modes, a first mode in which voltages are applied to said clamp terminals such that said diodes of said diode clamp are forward biased and hold said input line at a first voltage which prevents a passage of current from said input line to said common output, and a second mode in which the voltages are applied to said clamp terminals such that said diodes of said diode clamp are reverse biased and said passage of said current from said input line to said common output is allowed, and
    wherein only two connections to the diode clamp control switching of the respective input line.

2. The multiplexer circuit of claim 1, wherein said isolation means has an isolation diode.

3. The multiplexer circuit of claim 2, wherein said first voltage is selected to reverse bias said isolation diode, thereby preventing said passage of current from said respective input line to said common output.

4. The multiplexer circuit of claim 1, wherein said isolation means has a capacitor.

5. The multiplexer circuit of claim 4, wherein said first voltage is selected depending on a source of an input current, such as to prevent current flowing from said source of said input current.

6. An electric device comprising:
    an array of charge storage elements that are arranged in rows and columns and which are coupled to row and column conductors, said column conductors being arranged in at least one group, each group having a respective common output;
    a multiplexer circuit for switching a selected one of a plurality of current inputs carried by respective input lines to said common output, said multiplexer circuit having, for each input line, a diode clamp with first and second clamp terminals and first and second clamp diodes arranged in series with the same polarity between said clamp terminals; and isolation means between each input line and said common output, wherein each input line is connected to the isolation means and to a point between said first and second clamp diodes, and wherein said diode clamp operates in a first mode in which voltages are applied to the clamp terminals such that said diodes of said diode clamp are forward biased and hold a first voltage that prevents a passage of current from said input line to said common output, and a second mode in which said diodes of said diode clamp are reverse biased allowing for a passage of a current from said input line to said common output, said multiplexer circuit couples said column conductors of said respective groups to said respective common output; and
    a charge measurement device that measures a flow of charge from said common output,
    wherein charge storage elements comprise capacitive pixels having two diodes and a variable capacitor, the flow of charge measurement being used to determine the capacitance.

7. The electronic device of claim 6, wherein said isolation means has an isolation diode.

8. The electronic device of claim 6, wherein said pixels have capacitive fingerprint sensing elements in which the capacitance of said variable capacitor is determined by a fingerprint portion overlying a pixel.

* * * * *